US012666889B2

(12) United States Patent
Zhu et al.

(10) Patent No.: US 12,666,889 B2
(45) Date of Patent: Jun. 23, 2026

(54) METHOD FOR POROSIFYING A MATERIAL AND SEMICONDUCTOR STRUCTURE

(71) Applicant: CAMBRIDGE ENTERPRISE LTD, Cambridge (GB)

(72) Inventors: Tongtong Zhu, Cambridge (GB); Rachel A. Oliver, Cambridge (GB); Yingjun Liu, Cambridge (GB)

(73) Assignee: CAMBRIDGE ENTERPRISE LTD, Cambridge (GB)

( * ) Notice: Subject to any disclaimer, the term of this patent is extended or adjusted under 35 U.S.C. 154(b) by 0 days.

(21) Appl. No.: 18/060,317

(22) Filed: Nov. 30, 2022

(65) Prior Publication Data

US 2023/0096352 A1    Mar. 30, 2023

Related U.S. Application Data

(63) Continuation of application No. 16/651,055, filed as application No. PCT/GB2017/052895 on Sep. 27, 2017, now Pat. No. 11,651,954.

(51) Int. Cl.
| | |
|---|---|
| *H10P 14/60* | (2026.01) |
| *C25F 3/12* | (2006.01) |
| *H10H 20/01* | (2025.01) |

(52) U.S. Cl.
CPC .............. *H10P 14/665* (2026.01); *C25F 3/12* (2013.01); *H10H 20/01335* (2025.01)

(58) Field of Classification Search
CPC ..... H01L 21/02203; H01L 33/007; C25F 3/12
See application file for complete search history.

(56) References Cited

U.S. PATENT DOCUMENTS

| | | |
|---|---|---|
| 8,519,430 B2 | 8/2013 | Peng et al. |
| 9,070,827 B2 | 6/2015 | Peng et al. |
| (Continued) | | |

FOREIGN PATENT DOCUMENTS

| | | |
|---|---|---|
| CN | 102782818 A | 11/2012 |
| CN | 102782818 B | 4/2016 |
| (Continued) | | |

OTHER PUBLICATIONS

Office Action issued in Korean Patent Application No. 2023-7035387 (Jan. 30, 2024).
(Continued)

*Primary Examiner* — Jay C Kim
*Assistant Examiner* — Woo K Lee
(74) *Attorney, Agent, or Firm* — Merchant & Gould P.C.

(57) ABSTRACT

A method for porosifying a III-nitride material in a semiconductor structure is provided, the semiconductor structure comprising a sub-surface structure of a first III-nitride material, having a charge carrier density greater than $5 \times 10^{17}$ $cm^{-3}$, beneath a surface layer of a second III-nitride material, having a charge carrier density of between $1 \times 10^{14}$ $cm^{-3}$ and $1 \times 10^{17}$ $cm^{-3}$. The method comprises the steps of exposing the surface layer to an electrolyte, and applying a potential difference between the first III-nitride material and the electrolyte, so that the sub-surface structure is porosified by electrochemical etching, while the surface layer is not porosified. A semiconductor structure and uses thereof are further provided.

20 Claims, 7 Drawing Sheets

200

(56) References Cited

U.S. PATENT DOCUMENTS

| | | | |
|---|---|---|---|
| 9,206,524 B2 | 12/2015 | Zhang et al. | |
| 9,276,382 B2 | 3/2016 | Fischer et al. | |
| 9,583,353 B2 | 2/2017 | Han | |
| 9,922,838 B2 | 3/2018 | Dahal et al. | |
| 10,458,038 B2 * | 10/2019 | Zhang | H01L 21/0237 |
| 11,018,231 B2 | 5/2021 | Han et al. | |
| 11,095,096 B2 | 8/2021 | Han et al. | |
| 2012/0104455 A1 | 5/2012 | Peng et al. | |
| 2013/0011656 A1 | 1/2013 | Zhang et al. | |
| 2013/0328102 A1 | 12/2013 | Peng et al. | |
| 2014/0003458 A1 | 1/2014 | Han | |
| 2014/0203292 A1 | 7/2014 | Hwang et al. | |
| 2015/0270136 A1 | 9/2015 | Fischer et al. | |
| 2015/0303655 A1 | 10/2015 | Han et al. | |
| 2016/0153113 A1 | 6/2016 | Zhang et al. | |
| 2017/0237234 A1 * | 8/2017 | Han | H01S 5/1042 372/45.012 |
| 2020/0185882 A1 * | 6/2020 | Zhao | H01S 5/18361 |

FOREIGN PATENT DOCUMENTS

| | | | |
|---|---|---|---|
| CN | 105821435 A | 8/2016 | |
| CN | 105821435 B | 10/2018 | |
| EP | 3923352 A1 | 12/2021 | |
| JP | 2000-106455 | 4/2000 | |
| JP | 2005-129682 | 5/2005 | |
| JP | 2005-259832 | 9/2005 | |
| JP | 2006-513122 A | 4/2006 | |
| JP | 2009-060142 | 3/2009 | |
| JP | 2013-518447 A | 5/2013 | |
| JP | 2013-173641 | 9/2013 | |
| JP | 2014-507069 A | 3/2014 | |
| JP | 2014-527707 A | 10/2014 | |
| JP | 5763789 B2 | 8/2015 | |
| JP | 5961557 B2 | 8/2016 | |
| JP | 2018-502436 A | 1/2018 | |
| JP | 2018-517295 A | 6/2018 | |
| KR | 10-2013-0007557 A | 1/2013 | |
| KR | 2014-0030135 A | 3/2014 | |
| KR | 10-2014-0095390 | 8/2014 | |
| KR | 101550117 B1 | 9/2015 | |
| KR | 10-2017-0063919 | 6/2017 | |
| TW | 201218419 A | 5/2012 | |
| TW | 201234655 A | 8/2012 | |
| TW | I431810 B | 3/2014 | |
| TW | I451597 B | 9/2014 | |
| WO | 2003/103062 | 12/2003 | |
| WO | 2010/032423 | 3/2010 | |
| WO | 2011/094391 | 8/2011 | |
| WO | 2016/054232 | 4/2016 | |
| WO | 2016/187421 | 11/2016 | |

OTHER PUBLICATIONS

Notice of Allowance issued for Korean Patent Application No. 10-2022-7039532, Jul. 17, 2023, 4 pages including English translation.

Office Action issued for Japanese Patent Application No. 2022-009480, mailed on Dec. 6, 2022, 7 pages including machine translation.

Zhu, T. et al., "Wafer-scale Fabrication of Non-polar Mesoporous GaN Distributed Bragg Reflectors via Electrochemical Porosification," Sci. Rep., vol. 7, 45344, 2017, pp. 1-8.

Braniste T. et al., "Multilayer porous structures of HVPE and MOCVD grown GaN for photonic applications", Superlattices and Microstructures, Academic Press, London, GB, vol. 102, Dec. 23, 2016 (Dec. 23, 2016), pp. 221-234.

Cheng Zhang et al., "Mesoporous GaN for Photonic Engineering-Highly Reflective GaN Mirrors as an Example", ACS Photonics, vol. 2, No. 7, Jun. 30, 2015 (Jun. 30, 2015), pp. 980-986.

International Search Report and Written Opinion issued for PCT/GB2017/052895, Jun. 26, 2018, 12 pages.

Page 4 of PCT Request Form submitted on Sep. 27, 2017 in PCT/GBZ017/052895, Section VIII-5-1 Declaration: Non-prejudicial disclosure or exceptions to lack of novelty, 1 page.

Chen et al, "Nanopores in GaN by electrochemical anodization in hydrofluoric acid: Formation and mechanism," Journal of Applied Physics, 112, 064303 (2012).

Bing-Cheng Shieh, et al., "InGaN light-emitting diodes with embedded nanoporous GaN distributed Bragg reflectors," Applied Physics Express, vol. 8, No. 8, Jul. 8, 2015, pp. 1-4.

International Search Report and Written Opinion issued for PCT/GB2019/050213, Apr. 3, 2019, 15 pages.

Wang et al., "InGaN Quantum Dots by Quantum Size Controlled Photoelectrochemical Etching (Slides)," Sandia National Laboratories, 2016, 13 pages.

Pampili P. et al., "Doping of III-nitride materials," Materials Science in Semiconductor Pocessing 62 (2017) 180-191.

Zhu T. et al., "Unintentional doping in GaN," DOI: 10.1039/c2cp40998d Mar. 2012, 16 pages.

Office Action issued for Japanese Patent Application No. 2020-517083, mailed on Nov. 2, 2021, 10 pages including machine translation.

Office Action issued for Korean Patent Application No. 10-2020-7012100, Dec. 30, 2021, 12 pages including English translation.

Notice of Allowance issued for Japanese Patent Application No. 2020-517083, mailed Apr. 5, 2022, 7 pages including machine translation.

Notice of Allowance issued for Korean Patent Application No. 10-2020-7012100, Aug. 12, 2022, 3 pages including English translation.

Tanya K. Gachovska et al., "SiC and GaN Power Semiconductor Devices", Power Electronics Handbook: 95-155 (2018).

Office Action issued in U.S. Appl. No. 18/060,342 (Oct. 1, 2024).

* cited by examiner

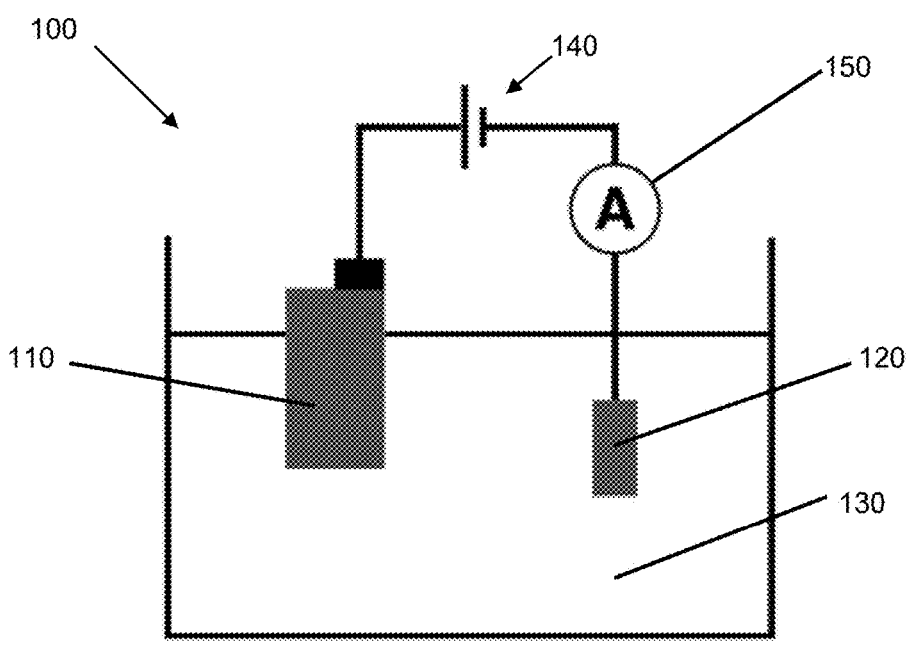
Figure 1
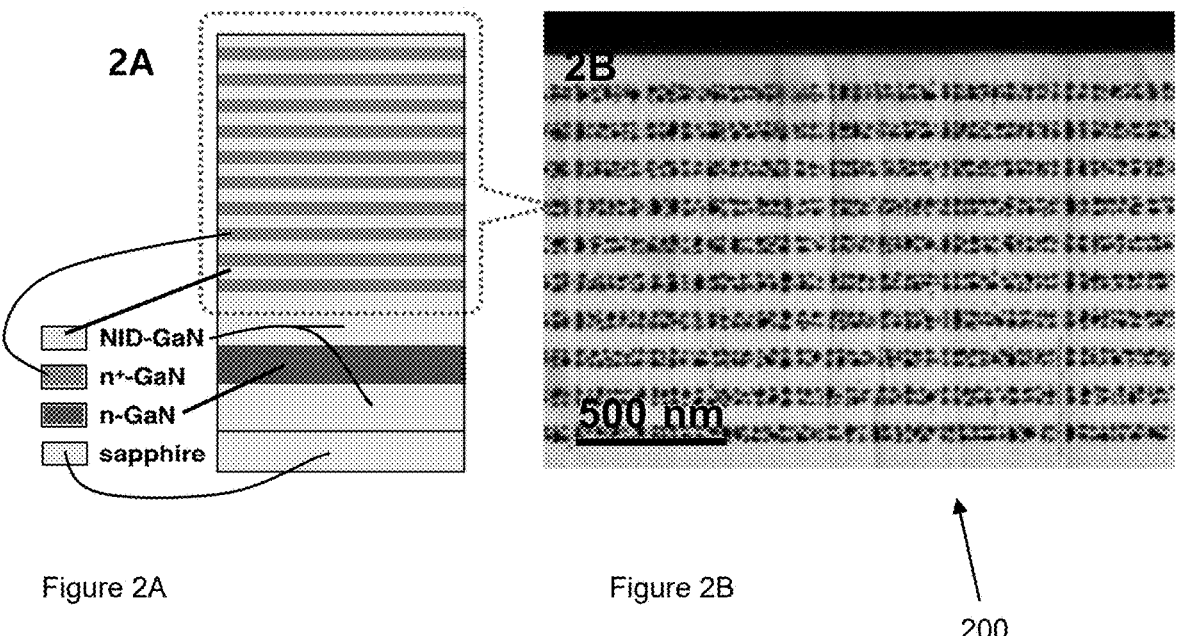
Figure 2A                              Figure 2B

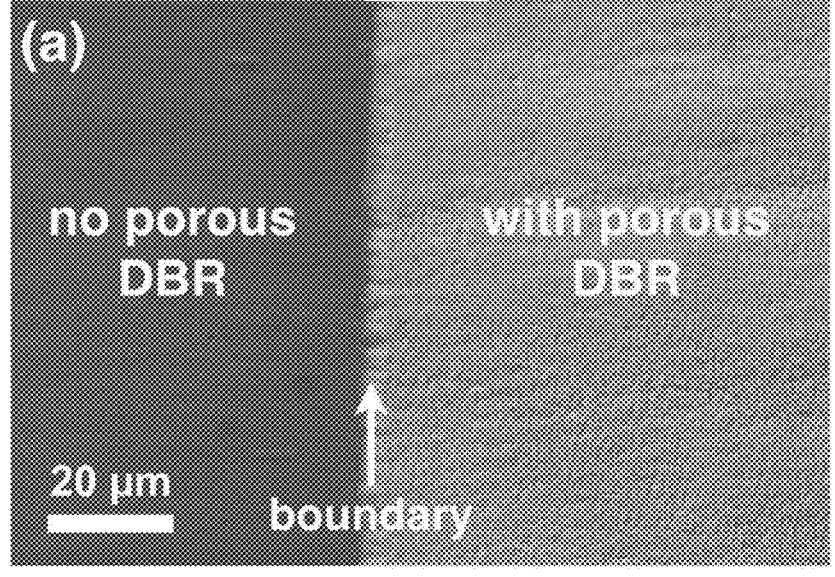
Figure 3A
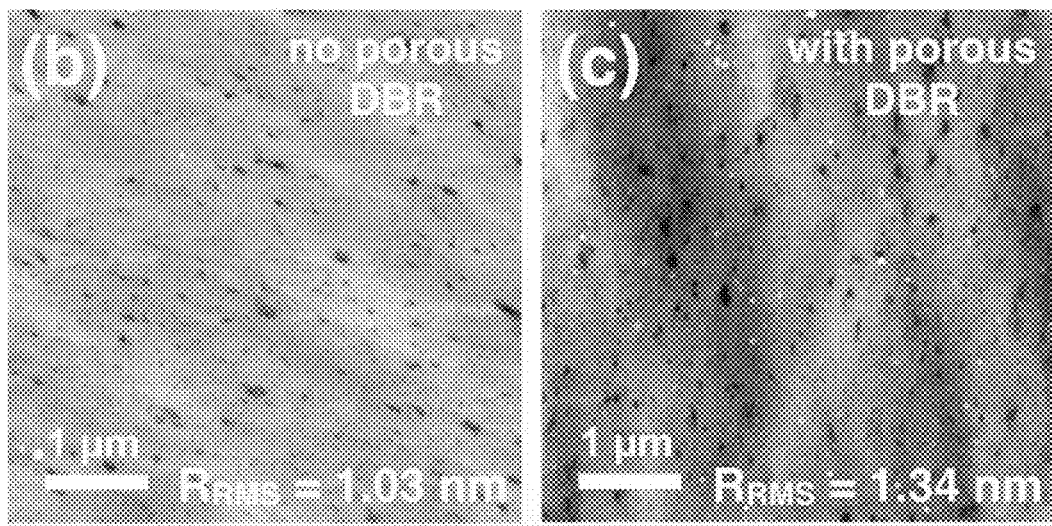
Figure 3B                       Figure 3C

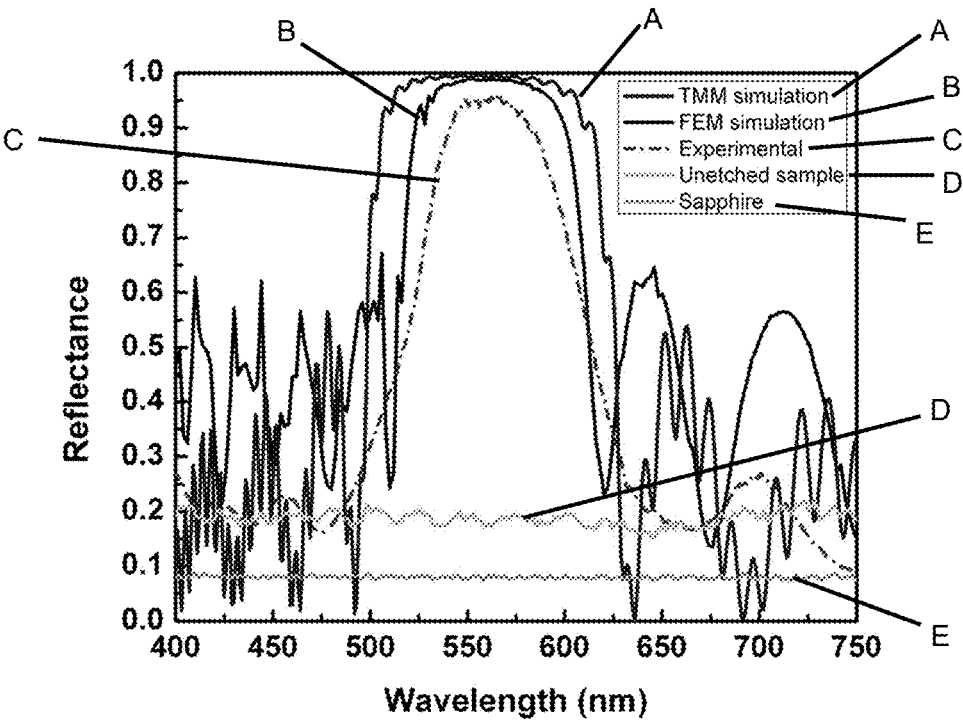
Figure 4
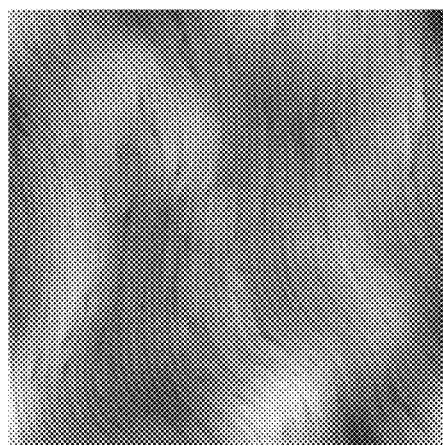
Figure 5A                                  Figure 5B

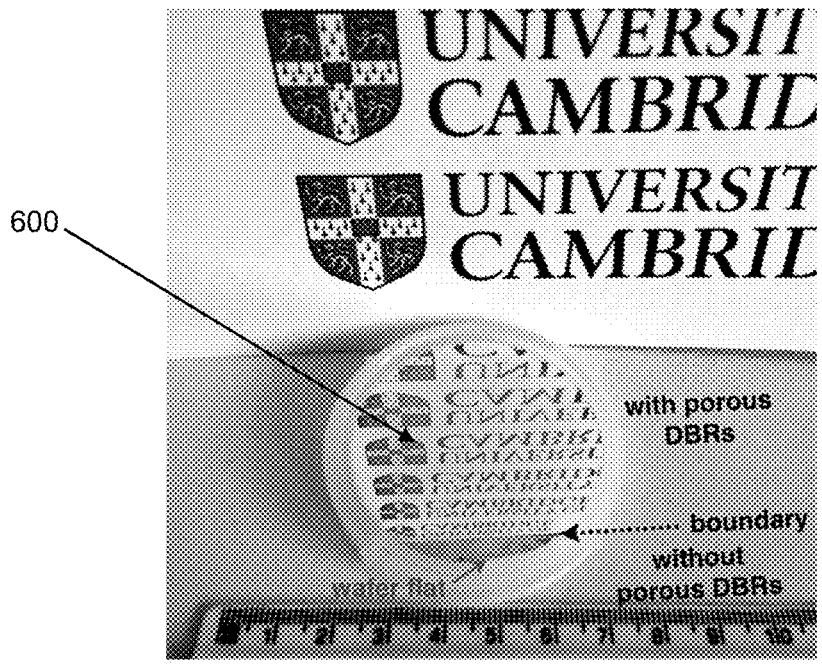
Figure 6
Figure 7A
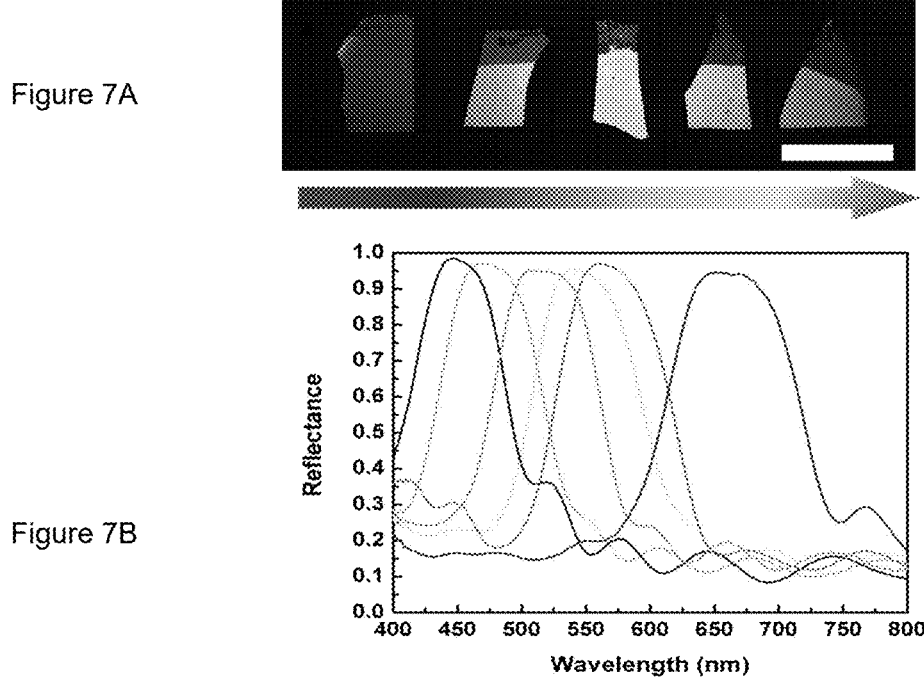
Figure 7B

800

850

800

850

860

800

L/I characteristic

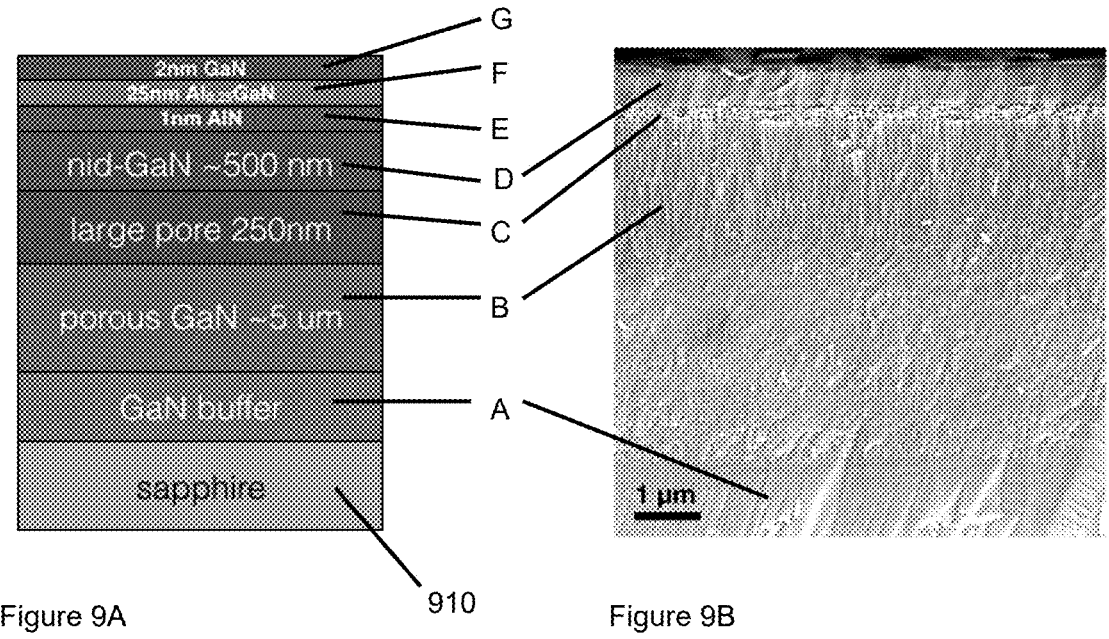
Figure 9A
Figure 9B
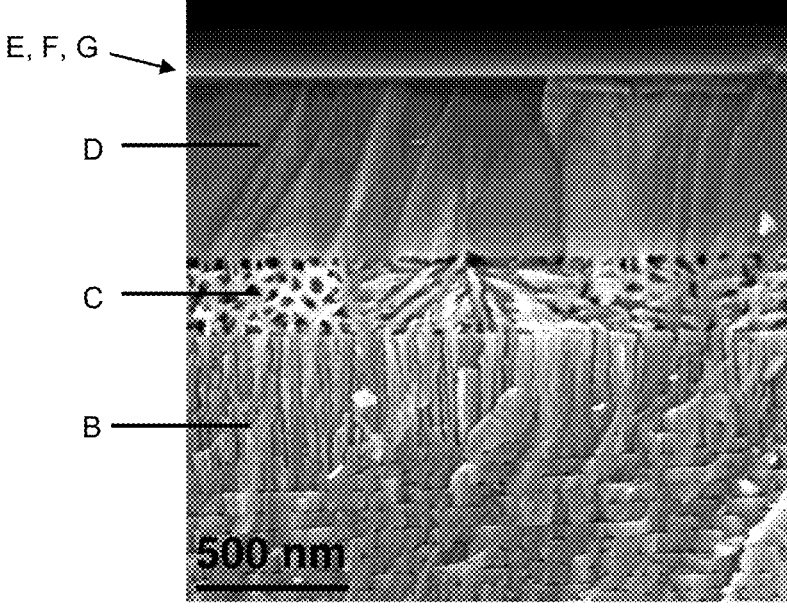
Figure 9C

METHOD FOR POROSIFYING A MATERIAL AND SEMICONDUCTOR STRUCTURE

The invention relates to a method for porosifying a semiconductor material, in particular a III-nitride material, a semiconductor structure, use of a semiconductor structure, and a device incorporating or mounted on a semiconductor structure. The invention may be particularly advantageous for the production of porous semiconductor structures for use as distributed Bragg reflectors (DBRs) and substrates in the fabrication of of semiconductor devices.

BACKGROUND

The class of semiconductor materials known as "μl-nitride" materials includes gallium nitride (GaN), indium nitride (InN) and aluminium nitride (AIN), along with their ternary and quaternary alloys. III-nitride materials have not only achieved commercial success in solid-state lighting and power electronics, but also exhibit particular advantages for quantum light sources and light-matter interaction.

While a variety of III-nitride materials are commercially interesting, Gallium nitride (GaN) is widely regarded as one of the most important new semiconductor materials, and is of particular interest for a number of applications.

It is known that the introduction of pores into bulk GaN can profoundly affect its material properties, for example its refractive index, without negatively affecting its electrical conductivity. The possibility of tuning the optical properties of GaN by altering its porosity therefore makes porous GaN of great interest for optoelectronic applications.

WO2011/094391A1 discloses the possibility of generating nanoporous GaN by an electrochemical etching method, whereby n-type doped GaN is etched to generate porosity by contacting the n-type doped GaN with an electrolyte and applying an etching potential. WO2011/094391A1 (paragraph [0031]) describes the etching of two types of GaN structure. In a first type, the surface of an exposed layer of n-type doped GaN is contacted with an electrolyte and etched, generating a porous layer. Etching proceeds perpendicularly to the layer surface and in WO2011/094391A1 is termed vertical etching. In a second type of structure a top layer of undoped GaN is formed over a layer of n-type doped GaN. The n-type doped GaN thus forms a sub-surface layer. The layers are then dry etched, or cleaved, to form trenches which expose edges or side-walls of the layers, and these edges can be exposed to an electrolyte. Etching then proceeds selectively through the n-type layer, from its exposed edge, porosifying the doped sub-surface layer but not the overlying undoped layer. In WO2011/094391A1 this is termed horizontal or lateral etching.

Electrochemical etching of n-type GaN has been further described in a variety of academic papers. All of these prior art documents follow the teaching of WO2011/094391A1 that etching can either be performed "vertically", directly into an exposed n-type GaN surface, or "horizontally", into the edges of an n-type GaN layer sandwiched between two layers of undoped GaN and/or an electrically insulating base layer.

Chen et al, *Journal of Applied Physics*, 112, 064303 (2012) relates to vertical etching of n-type GaN, and describes the use of an underlying undoped GaN layer of 500 nm thickness as an "etch stop" to prevent further etching. Chen et al further notes that vertical etching caused surface pits to be formed in the surface of the n-type GaN.

C. Zhang, et al. ACS *Photonics* 2015, 2, 980, on the other hand, discloses horizontally etching a multi-layer structure consisting of alternate layers of undoped GaN and n-type GaN. In order to allow horizontal etching, the multi-layer sample was first lithographically patterned with trenches at intervals of 50 μm, in order to expose the edges or side-walls of the layers, and allow electrolyte transport horizontally into the n-type layers during porosification. An electrically insulating layer of $SiO_2$ was also formed as a protective layer on top of the uppermost layer of undoped GaN.

Horizontal, or lateral, etching from the edge of a sub-surface layer is limited by factors including the diffusion rate of electrolyte into and out of the layer during etching, meaning that there is a limit to the distance from an edge of a layer that can be etched, and therefore that there is a limit to the width of a sample that can be porosified by horizontal etching (if etched from opposite edges).

The authors of the prior art have addressed this sample-size limitation by dry-etching vertical trenches into samples prior to etching, so that the edges of the sample layers are exposed at regular intervals. This allows the electrolyte to contact the layer edges and etch horizontally into the sample structure. Dry-etching trenches means that each sample is effectively divided up into a plurality of smaller samples extending between adjacent trenches. The distance between adjacent trenches is naturally limited to twice the distance (assuming that a sample is horizontally etched from both sides) that it is possible for horizontal etching to penetrate into a layer. In C. Zhang, et al, for example, sample width for horizontal etching is limited to dimensions of 50 μm between trenches.

This additional processing step both increases the cost of wafer processing, and limits the maximum dimension of the resulting porosified structure. Dividing semiconductor structures into small mesas by dry-etching trenches may also make the resulting porosified structure unsuitable for use in fabrication of certain semiconductor devices. This technique may therefore limit the viability of horizontal etching methods, and their resulting structures, for practical optoelectronic devices on a large scale.

Furthermore, the horizontal etching methods of the prior art include the application of a relatively thick dielectric layer on top of the semiconductor structure prior to etching. This dielectric layer, which is frequently formed from silica ($SiO_2$), covers the surface layer and prevents the electrolyte from contacting the surface layer of the sample during etching. This layer acts as a mask to protect the surface layer from damage, either during dry-etching of trenches, or during the horizontal etching process. The application of this layer, and its subsequent removal if necessary, introduces yet further processing steps and constrains the material design.

SUMMARY OF THE INVENTION

The invention provides a method for porosifying a III-nitride material, a semiconductor structure, use of a semiconductor structure, and a device incorporating or mounted on a semiconductor structure, as defined in the appended independent claims to which reference should now be made. Preferred or advantageous features of the invention are set out in dependent subclaims.

The inventors' publication Zhu, T. et al. Wafer-scale Fabrication of Non-polar Mesoporous GaN Distributed Bragg Reflectors via Electrochemical Porosification. Sci. Rep. 7, 45344; doi: 10.1038/srep45344 (2017) is hereby incorporated by reference in its entirety.

According to a first aspect of the invention there is provided a method for porosifying a III-nitride material in a semiconductor structure. The semiconductor structure comprises a sub-surface structure of a first III-nitride material having a charge carrier density greater than $5 \times 10^{17}$ cm$^{-3}$, beneath a surface layer of a second III-nitride material having a charge carrier density of between $1 \times 10^{14}$ cm$^{-3}$ and $1 \times 10^{17}$ cm$^{-3}$. The method comprises the steps of exposing the surface layer to an electrolyte, and applying a potential difference between the sub-surface structure and the electrolyte, so that the sub-surface structure is porosified by electrochemical etching, while the surface layer is not porosified.

The method may alternatively be termed a method for, or of, sub-surface porosification of a III-nitride material. As sub-surface III-nitride material may be selectively porosified depending on its charge carrier density, such a method may be a method of selectively porosifying III-nitride material.

The sub-surface structure may be provided in a desired arrangement, or pattern, beneath the surface layer. Preferably the sub-surface structure forms a sub-surface layer beneath the surface layer. Particularly preferably the sub-surface structure forms a continuous, or unbroken, sub-surface layer beneath the surface layer.

The sub-surface structure may advantageously be porosified by electrochemical etching through the surface layer. That is, the method may be a method of through-layer porosification.

Unlike in the prior art, in the present method it is not necessary to expose the III-nitride material that is to be etched to the electrolyte. In WO2011/094391A1, for example, both "horizontal" etching and "vertical" etching require that an edge or surface of the layer to be etched is exposed to the electrolyte. Where the top surface of n-type doped GaN is exposed, "vertical" etching occurs down into the layer. Where only side-walls or edges of the n-type doped layers are exposed to the electrolyte, "horizontal" etching occurs inwardly into those exposed edges.

The present method allows etching by exposing the surface layer of III-nitride material, which has a charge carrier density of between $1 \times 10^{14}$ cm$^{-3}$ and $1 \times 10^{17}$ cm$^{-3}$, to the electrolyte. However, it is not necessary to expose the sub-surface structure (the material that is to be etched) to the electrolyte.

The step of exposing the surface layer to an electrolyte may alternatively be described as contacting the surface layer with an electrolyte. Preferably the upper, top, or outermost, surface of the surface layer is exposed to the electrolyte. Particularly preferably only the surface layer is exposed to the electrolyte.

In the prior art, where the surface layer of nominally "undoped" GaN is masked by a layer of dielectric material such as SiO$_2$, the top surface of the surface layer is not exposed to the electrolyte.

The surface layer may cover only the upper surface of the sub-surface structure. In other words, the sub-surface structure may be arranged below, or underneath, the surface layer, or the surface layer may be arranged over the sub-surface structure. The side-walls, or edges, of the sub-surface structure may be exposed, that is, not covered by the surface layer.

Alternatively, the sub-surface structure may be completely covered by the surface layer. That is, both the upper surface and the side-walls, or edges, of the sub-surface structure may be covered by the surface layer. Thus, if a structure formed from the sub-surface structure and the surface layer were to be completely immersed in electrolyte, the surface layer may be the only material exposed to the electrolyte.

While the prior art has disclosed the use of undoped GaN as an "etch stop" which halts the progress of electrochemical etching, the inventors have found that the use of a surface layer of GaN, or other III-nitride material, having a charge carrier density of between $1 \times 10^{14}$ cm$^{-3}$ and $1 \times 10^{17}$ cm$^{-3}$ allows electrochemical etching to take place through the surface layer of the second III-nitride material. In other words, a sub-surface structure can be porosified by etching through the surface layer, without directly contacting the sub-surface structure with the electrolyte, and without etching the surface layer itself.

By controlling the charge carrier density of the surface layer, as well as the charge carrier density of the sub-surface structure, the inventors have found that a sub-surface structure of first III-nitride material can be porosified through a surface layer without the surface layer itself being porosified. Particularly advantageously, the sub-surface structure can be electrochemically etched without the surface layer being damaged or roughened during the etching process. Thus, the method of the present invention may advantageously allow the selective porosification of a complex (eg. multi-layered) III-nitride structure without having to apply a protective electrically conductive layer, of SiO$_2$ for example, onto the surface layer. This may eliminate the need for the time-consuming and costly extra processing steps of applying, and subsequently removing, a protective top layer that are required by the prior art before the porous structure can be used.

The surface layer may have a charge carrier density of at least $5 \times 10^{14}$ cm$^{-3}$, or $1 \times 10^{15}$ cm$^{-3}$, or $5 \times 10^{15}$ cm$^{-3}$, and/or less than $7 \times 10^{15}$ cm$^{-3}$, or $1 \times 10^{16}$ cm$^{-3}$, or $5 \times 10^{16}$ cm$^{-3}$, or $8 \times 10^{16}$ cm$^{-3}$, so that the surface layer is not porosified during etching.

If the charge carrier density of the surface layer is below $1 \times 10^{14}$ cm$^{-3}$, the surface layer may be too electrically resistive to allow electrochemical etching through the surface layer, as there are not enough charge carriers present to carry current to the sub-surface structure to be porosified.

If the charge carrier density of the surface layer is above $1 \times 10^{17}$ cm$^{-3}$, however, the surface layer may be sufficiently electrically conductive that the surface layer is itself porosified during the electrochemical process. Thus, the surface layer may experience porosification, "pitting" in its surface, and/or roughening that makes the surface layer unsuitable for further processing, for example further epitaxial overgrowth. This may occur where the impurity concentration in the surface layer is too high, so that the surface layer has a charge carrier density of above $1 \times 10^{17}$ cm$^{-3}$, even though the layer may not have been intentionally doped.

By controlling the charge carrier densities of the layers, and the contrast in charge carrier density between adjacent layers, it is possible to pre-determine the layers which will be porosified by electrochemical etching.

The sub-surface structure may have a charge carrier density of at least $5 \times 10^{17}$ cm$^{-3}$, or at least $1 \times 10^{18}$ cm$^{-3}$, or at least $5 \times 10^{18}$ cm$^{-3}$, or at least $1 \times 10^{19}$ cm$^{-3}$, or at least $5 \times 10^{19}$ cm 3, or at least $1 \times 10^{20}$ cm$^{-3}$, and/or less than $1 \times 10^{21}$ cm$^{-3}$, or $5 \times 10^{21}$ cm$^{-3}$, or $1 \times 10^{22}$ cm$^{-3}$, if it is to be porosified by electrochemical etching.

The inventors have found that sub-surface structures having a charge carrier density greater than $5 \times 10^{17}$ cm$^{-3}$ may be porosified by the method of the present invention, while layers with a charge carrier density of less than $1 \times 10^{17}$ cm$^{-3}$ may not be porosified. Between $1 \times 10^{17}$ cm$^{-3}$ and $5 \times 10^{17}$ cm$^{-3}$ porosification may be possible, but using charge carrier densities outside this range may advantageously create a contrast in the electrical conductivity of the surface and sub-surface structure to encourage that the sub-surface structure is selectively porosified.

In order to avoid damage to "undoped" surface layers, the authors of the prior art have found it necessary to apply protective dielectric layers to the top surfaces of their samples.

The skilled person will appreciate that the term "undoped" is relatively imprecise in semiconductor technology, as practically speaking, all semiconductor material contains inherent impurities which can be thought of as "dopant" atoms. Different methods of semiconductor growth may produce different levels of impurity, and thus different inherent charge carrier concentrations. Where impurity levels are high, the resulting semiconductor material may have a charge carrier density of above $1 \times 10^{17}$ cm$^{-3}$, even though the layer has not been intentionally doped.

Thus, the reason that the authors of the prior art have found it necessary to apply protective dielectric layers to prevent undesired etching of surface layers may be that their "undoped" surface layers in fact have a charge carrier density of above $1 \times 10^{17}$ cm$^{-3}$, such that the surface layers were themselves etched, or partially etched, on application of a potential difference. By applying a dielectric layer to the top of the surface layer the surface layer is protected from accidental etching regardless of its charge carrier concentration.

The presence of an electrically insulating layer on the outer surface of the surface layer would prevent electrical conduction through the surface layer to the sub-surface structure(s) below, so would prevent electrochemical etching through the surface layer.

Coating the outer surface of the surface layer in a dielectric material, as has been done in the prior art, may force etching to proceed horizontally, into the exposed edges of layers.

The authors of the prior art have found that, by doing this, only the n-type doped GaN layers were porosified, while "undoped" GaN layers were not porosified, and acted as "etch stops".

The inventors of the present invention hypothesise that, in the prior art, horizontal etching proceeds selectively into exposed edges of the "n-type" layers because these layers offer the path of lowest electrical resistance. Thus, even if the nominally "undoped" GaN layers of the prior art in reality have a charge carrier density of above $1 \times 10^{17}$ cm$^{-3}$, horizontal etching would preferentially proceed into the "n-type" layers as long as these layers have a higher charge carrier density, and thus a higher electrical conductivity, than the "undoped" layers.

When the electrolyte is in contact with the exposed top surface of the surface layer, this "path of lowest resistance" behaviour is not possible. The charge carrier concentration of the surface layer must therefore be controlled so that etching through the surface layer can take place, but without causing damage to or porosification of the surface layer itself.

Thus, the method of the present invention may advantageously provide a method of porosifying III-nitride materials with fewer processing steps than are necessary in the methods of the prior art, and which may advantageously be able to porosify large sample sizes without the need for pre-etching trenches.

Preferably the surface layer and the sub-surface structure comprise a III-nitride material selected from the list consisting of: GaN, AlGaN, InGaN, InAlN and AlInGaN. The surface layer and the sub-surface structure may be formed from the same III-nitride material, but with a different charge carrier density in each layer, or the layers may be formed of different III-nitride materials.

Suitable III-nitride materials may for example have any polar crystal orientation or non-polar crystal orientation. Suitable III-nitride materials may have any crystal structure, for example a wurtzite or cubic structure, and any crystal orientation. For example, suitable III-nitride materials may include polar c-plane, non-polar a plane, or even cubic III-nitride materials.

In a particularly preferred embodiment, the surface layer consists of GaN with a charge carrier density of between $1 \times 10^{14}$ cm$^{-3}$ and $1 \times 10^{17}$ cm$^{-3}$, and the sub-surface structure consists of n-type doped GaN with a charge carrier density greater than $5 \times 10^{17}$ cm$^{-3}$.

Preferably the sub-surface structure consists of n-type doped III-nitride material. Particularly preferably the sub-surface structure is doped with silicon (Si), germanium (Ge) and/or oxygen (O).

The charge carrier density of a given layer is readily measurable by the skilled person, for example by capacitance-voltage profiling or calibrated scanning capacitance microscopy. A depth profiling Hall effect technique may also be suitable. The charge carrier density may alternatively be termed the carrier density, or the carrier concentration. References to charge carrier density herein refer to the charge carrier density at room temperature.

In a preferred embodiment, the sub-surface structure consists of a planar sub-surface layer of a first III-nitride material. The surface layer and the sub-surface structure may form adjacent planar layers, so that an upper surface of the sub-surface layer is in contact with a lower surface of the surface layer, or they may be separated by intervening layers of III-nitride material. Preferably the sub-surface layer may be one of a plurality of sub-surface layers formed from the same III-nitride material, or different III-nitride materials.

The surface layer and the sub-surface structure may be formed by epitaxial growth. The surface layer and the sub-surface structure may be formed by molecular beam epitaxy (MBE), metalorganic chemical vapour deposition (MOCVD) (also known as metalorganic vapour phase epitaxy (MOVPE)), hydride vapour phase epitaxy (HVPE), ammonothermal processes, or other conventional processes suitable for growing III-nitride materials with the necessary charge carrier concentrations.

The surface layer and the sub-surface structure(s) may be grown on an electrically insulating base layer, or substrate. Preferably the base layer is configured to form the bottom of a multi-layer structure, the surface layer forms the top of the multi-layer structure, with the sub-surface structure(s) arranged in between the surface layer and the base layer. Preferably the electrically insulating base layer may comprise sapphire, silicon, silicon carbide, LiAlO$_3$, glass or bulk GaN.

Electrochemical etching may be carried out in a variety of acidic or basic electrolytes. For example, suitable electrolytes include Oxalic acid, KOH, NaOH, HF, HCl, and HNO$_3$.

Preferably the electrolyte should form a wetting angle, or contact angle, of 120 degrees or greater with the exposed surface of the surface layer.

In order to electrochemically etch a sample, an electrochemical cell is arranged so that the sample itself acts as an anode, and an inert electrode such as a platinum foil electrode serves as a cathode. The sample and the platinum electrode are connected to a power supply, and the sample is immersed, or partially immersed, in the electrolyte to form a circuit.

In order to apply a potential difference between the electrolyte and a sub-surface structure of the sample, the sub-surface structure to be porosified should be electrically connected to, or in electrical contact with, the terminal of the power supply.

In order to perform electrochemical etching, the power supply is controlled to apply a potential difference (voltage) between the sub-surface structure and the electrolyte, causing a current to flow through the electrolyte and the sample. The flow of current through the sample causes electrochemical etching of any sub-surface structures with a charge carrier density greater than $5 \times 10^{17}$ cm$^{-3}$, such that the porosity of these layers increases.

Preferably the applied potential difference between the sub-surface structure and the electrolyte is at least 4 volts (v), or 6 V, or 8V, or 10 V, or 15 V and/or less than 20 V, or 25 V, or 30 V in order to selectively porosify the sub-surface structure.

Electrochemical etching may be carried out in continuous or pulsed modes, and may be controlled by controlling the voltage or current across the cell.

Advantageously, the progress of the etching reaction may be monitored by measuring the etching current during the reaction.

After etching, samples can be cleaned by rinsing in deionized water and drying with N$_2$, to ensure complete dissolution of any residue etching chemicals and products, without affecting the porous structure of the sub-surface structures.

Preferably the charge carrier density in the sub-surface structure is at least 5 times, or 10 times, or 100 times, or 1000 times, or 10,000 times, or 100,000 times, or 1,000,000 times higher than the charge carrier density in the surface layer. Increased differences between the charge carrier densities of different layers, which may be thought of as increased "contrast" in charge carrier densities, may advantageously increase the selectivity of the etching process.

Preferably the threading dislocation density in both the surface layer and the sub-surface structure is between $1 \times 10^4$ cm$^{-2}$ and $1 \times 10^{10}$ cm$^{-2}$. Particularly preferably the threading dislocation density in both the surface layer and the sub-surface structure is substantially equal in the surface layer and the sub-surface structure. Preferably the threading dislocation density in both the surface layer and the sub-surface structure is at least $1 \times 10^4$ cm$^{-2}$, $1 \times 10^5$ cm$^{-2}$, $1 \times 10^6$ cm$^{-2}$, $1 \times 10^7$ cm$^{-2}$, or $1 \times 10^8$ cm$^{-2}$ and/or less than $1 \times 10^9$ cm$^{-2}$ or $1 \times 10^{10}$ cm$^{-2}$. Typically, growers of semiconductor materials seek to minimise the threading dislocation density of the material in an effort to improve material quality. In the present invention, however, a sufficient threading dislocation density between the surface layer and the sub-surface layer may be required to allow electrochemical etching through the surface layer. This may be due to increased electrolyte or charge carrier transport to the sub-surface layer.

The surface layer is preferably a continuous layer of III-nitride material. That is, the surface layer is preferably substantially free from holes or large-scale defects.

In a preferred embodiment, the sub-surface structure may also be a continuous sub-surface layer of III-nitride material.

The thickness of the surface layer is preferably at least 1 nm, or 10 nm, or 100 nm, and/or less than 1 μm, or 5 μm, or 10 μm. In a preferred embodiment, the thickness of the surface layer is 50 nm.

The thickness of the sub-surface structure, or sub-surface layer, is preferably at least 1 nm, or 10 nm, or 100 nm, and/or less than 1 μm, or 5 μm, or 10 μm.

Particularly preferably, an outer surface of the continuous surface layer has a minimum lateral dimension of at least 300 μm, or at least 600 μm, or at least 1 mm, or at least 10 mm, or at least 5 cm, or at least 15 cm, or at least 20 cm.

Particularly preferably, the sub-surface structure is also a continuous layer, and has a minimum lateral dimension of at least 300 μm, or at least 600 μm, or at least 1 mm, or at least 10 mm, or at least 5 cm, or at least 15 cm, or at least 20 cm.

The minimum lateral dimension of a layer refers to the lateral width of a layer at its narrowest point. The layers used in preferred embodiments of the present invention are relatively large and thin, so the lateral dimensions of a layer should be understood to refer to the dimensions of the "top" and "bottom" surfaces of the layer, where the thickness of a layer refers to its "height", i.e. the distance between its top and bottom surfaces. Thus, where the top surface of a sample is square, the minimum lateral dimension of the sample would be the distance between opposite edges of the square. The "bottom" surface in this situation should be understood to be the surface formed first during epitaxial growth of a layer on a substrate, while the "top" surface is the surface formed on the side of the layer opposite the "bottom" surface.

The method of the present invention may advantageously be capable of porosifying far larger semiconductor structures than would be possible using the horizontal etching techniques of the prior art. As the method of the present invention produces electrochemical etching of sub-surface structures through a surface layer, and not horizontally in from the exposed edges of each individual layer, the effectiveness of the present invention is not limited to a maximum sample width.

It is possible to uniformly porosify a continuous sub-surface layer of an entire 2-inch semiconductor wafer using the present method, without first forming regular trenches in the wafer to expose the layer edges. This is not possible with the etching methods of the prior art, as horizontal etching could not etch into the centre of such a large wafer. Horizontal etching would be restricted to etching a distance of a few tens, or hundreds, of micrometres from the edges of the wafer. It is further possible to uniformly porosify a continuous sub-surface layer of an entire 2-inch semiconductor wafer without protecting the the surface layer with an electrically insulating layer. This is again not possible with the etching methods of the prior art, which require protection of the top surface.

The horizontal etching characteristics of the prior art have been extensively studied, and have been found to be restricted in the rate of etching in from the sample edges. Limitations such as electrolyte and charge transport may also mean that beyond a certain sample width, horizontal etching cannot reach the centre of the sample after any amount of time. Concentration of current at the sample edges for extended periods of time may also lead to uneven porosification across layers, with high porosity concentrated at the sample edges, and little porosification occuring at the sample centre.

For these reasons, the authors of the prior art have resorted to pre-preparing samples by dry-etching trenches at regular intervals across the sample, in order to allow electrolyte to access sample edges every 50 μm or so. This allows electrolyte to access the exposed edges of sub-surface layers, so that horizontal etching may occur.

The inventors of the present invention have circumvented these problems by etching through a surface layer rather than only from the edges of the layer. This method may advantageously allow porosity to develop evenly across the sub-surface layers rather than from the edges in. This may advantageously reduce the time required to etch a sample, and increase the uniformity of porosification, compared to horizontal etching alone.

Particularly advantageously, as access to layer edges is not required, the method of the present invention does not require samples to be pre-prepared by creating trenches in the layers. The present invention may thus require fewer processing steps, and allow the porosification of large, continuous, semiconductor layers, without the need to break the layers up with regular trenches.

Further, as the present method does not require access to the edges of material to be etched, a variety of sub-surface structures may be porosified. Unlike in the prior art, there is no need for the sub-surface structures to extend to the edge of a sample, or to present a large surface area of a side-wall for exposure to electrolyte during the etching process. Thus a variety of patterns or structures of porous material may be formed as porous sub-surface structures under the surface layer.

Preferably the method may produce pores in the sub-surface structure with an average pore size of greater than 1 nm, or 2 nm, or 10 nm, or 20 nm, and/or less than 50 nm, or 60 nm, or 70 nm.

The pore size and morphology, and the resulting percentage porosity of the sub-surface structure, may advantageously be controlled by controlling the charge carrier concentration of the sub-surface structure(s) and controlling the potential difference applied between the electrolyte and the sub-surface structure(s) during etching.

Preferably, the method may porosify the sub-surface structure such that it is microporous.

That is, it has an average pore size of less than 2 nm. Alternatively, the method may porosify the sub-surface structure such that it is mesoporous. That is, it has an average pore size between 2 nm and 50 nm. Alternatively, the method may porosify the sub-surface structure such that it is macroporous. That is, it has an average pore size of greater than 50 nm.

In a preferred embodiment, the method may be used to porosify a plurality of sub-surface structures. The method may thus comprise the step of applying a potential difference between the sub-surface structures to be porosified and the electrolyte, so that structures having a charge carrier density greater than $5 \times 10^{17}$ cm$^{-3}$ are porosified by electrochemical etching, while structures with a charge carrier density between $1 \times 10^{14}$ cm$^{-3}$ and $1 \times 10^{17}$ cm$^{-3}$ are not porosified.

In a particularly preferred embodiment, the sub-surface structures may be sub-surface layers, and the method may be used to porosify a plurality of sub-surface layers. Where the semiconductor structure comprises a plurality of sub-surface layers formed from III-nitride material, the method may comprise the step of: applying a potential difference between the sub-surface layers to be porosified and the electrolyte, so that layers having a charge carrier density greater than $5 \times 10^{17}$ cm$^{-3}$ are porosified by electrochemical etching, while layers with a charge carrier density between $1 \times 10^{14}$ cm$^{-3}$ and $1 \times 10^{17}$ cm$^{-3}$ are not porosified.

Layers having a charge carrier density greater than $5 \times 10^{17}$ cm$^{-3}$ may be porosified by electrochemical etching through the layers above.

By controlling the charge carrier density of each layer, it is possible to control which of a plurality of sub-surface layers are porosified by the electrochemical etching process. Thus, a variety of multi-layer structures may be grown, in order to achieve different porosity characteristics in predetermined layers.

If a sub-surface structure, or layer, is to be porosified by electrochemical etching, its charge carrier density should be greater than $5 \times 10^{17}$ cm$^{-3}$. Above this threshold, the porosity of the resulting porous structure varies approximately with the charge carrier density of the initial sub-surface structure. Thus, where two sub-surface structures are provided with charge carrier densities greater than $5 \times 10^{17}$ cm$^{-3}$, the sub-surface structure with the higher charge carrier density will be porosified to a greater extent than the other structure, provided the same potential difference is applied to each.

In a preferred embodiment, the sub-surface structures form a plurality of sub-surface layers arranged in a stack, one above the other. The method of the present invention may advantageously etch sub-surface layers sequentially from the surface layer down. That is, the sub-surface layer nearest the surface layer may be porosified first, following which etching will proceed down through the structure to the next sub-surface layer with a charge carrier density greater than $5 \times 10^{17}$ cm$^{-3}$, which will then be porosified in turn, and so on.

Particularly advantageously, this sequential etching may allow a user to control the porosity of a particular sub-surface layer by controlling the potential difference between the electrolyte and the sub-surface layer during electrochemical etching of that layer. Monitoring the etching current during etching may advantageously allow the user to monitor the progress of etching sequentially through the multi-layer stack, so that the potential difference may be controlled during electrochemical etching of a particular layer.

In a particularly preferred embodiment, the sub-surface structure is a first sub-surface layer, and the semiconductor structure comprises a second sub-surface layer of a III-nitride material, the second sub-surface layer having a charge carrier density between $1 \times 10^{14}$ cm$^{-3}$ and $1 \times 10^{17}$ cm$^{-3}$; and a third sub-surface layer of a III-nitride material, the third sub-surface layer having a charge carrier density greater than $5 \times 10^{17}$ cm$^{-3}$, in which the second sub-surface layer is disposed between the first and third sub-surface layers. The method may comprise the additional step of applying a potential difference between the third sub-surface layer and the electrolyte; so that the third sub-surface layer is porosified by electrochemical etching, while the surface layer and the second sub-surface layer are not porosified.

In addition to porosification of the first sub-surface layer, the third sub-surface layer may be porosified by electrochemical etching through the surface layer, the first sub-surface layer and the second sub-surface layer.

The method of the present invention may thus allow selective sub-surface porosification of a plurality of sub-surface layers based on their charge carrier densities, by etching through the surface layer, and any further sub-surface layers with a charge carrier density between $1 \times 10^{14}$ cm$^{-3}$ and $1 \times 10^{17}$ cm$^{-3}$. Particularly advantageously, the method may porosify those sub-surface layers with a charge carrier density greater than $5 \times 10^{17}$ cm$^{-3}$ without damaging, roughening or porosifying those layers with a charge carrier density between $1 \times 10^{14}$ cm$^{-3}$ and $1 \times 10^{17}$ cm$^{-3}$.

Preferably the root mean square roughness of the surface layer is not altered during electrochemical etching. Particularly preferably, after etching the outermost surface of the surface layer may have a root mean square roughness of less than 10 nm, or less than 5 nm, or less than 2 nm, or less than 1 nm, or less than 0.5 nm, over an area of 1 micrometre squared. That is, the method of the present invention may produce an "epi-ready" surface, wherein the root mean square roughness of the surface layer is low enough to carry out further epitaxial growth on the surface layer without intermediate processing steps.

In a preferred embodiment, the surface layer and sub-surface layer(s) are provided as a wafer with a diameter of 1 inch (2.54 cm), or 2 inches (5.08 cm), or 6 inches (15.24 cm), or 8 inches (20.36 cm).

As the present method provides electrochemical etching through layers with a charge carrier density between $1\times10^{14}$ $cm^{-3}$ and $1\times10^{17}$ $cm^{-3}$, it is possible to etch a region of the sub-surface structure, or layer, that is far from any side-wall or edge of the semiconductor structure.

Thus, the present method may advantageously etch a region of the sub-surface structure that is at least 300 μm, or 500 μm, or 750 μm, or 1 mm, or 1 cm, or 5 cm, away from the nearest side-wall, or edge, of the semiconductor structure. This would not be possible with horizontal etching, which is limited in the distance that it is possible to etch in from a layer edge, to a few tens, or at most a few hundreds of micrometres.

Particularly preferably, the method is carried out without providing trenches in the surface layer and the sub-surface structure.

Preferably the surface layer is not coated with an electrically insulating layer during electrochemical etching.

Preferably the sample is not illuminated with UV illumination during electrochemical etching.

According to a second aspect of the present invention, there is provided a semiconductor structure formed by the method described above as the first aspect of the invention.

According to a third aspect of the present invention, there is provided a semiconductor structure comprising a porous sub-surface structure of a first III-nitride material; and a surface layer of a second III-nitride material, the surface layer having a charge carrier density of between $1\times10^{14}$ $cm^{-3}$ and $1\times10^{17}$ $cm^{-3}$, in which the sub-surface structure has uniform porosity throughout the structure, and in which both the surface layer and the sub-surface structure have a minimum lateral dimension of more than 550 μm.

According to a preferred embodiment, the semiconductor structure may be a multi-layer semiconductor structure.

As discussed above in relation to the first aspect of the invention, the horizontal etching methods of the prior art are not capable of porosifying a sub-surface layer with a minimum lateral dimension of more than a few hundred micrometres. In structures that are pre-patterned with vertical trenches cut into the layers, the minimum lateral dimension of the sample may be the distance between adjacent trenches.

Furthermore, horizontal etching methods may not create a porous sub-surface layer that has uniform porosity throughout the layer. Particularly where the minimum lateral dimension of the sub-surface layer is relatively large, for example 250 μm, limitations in electrolyte and/or charge transport into the layer from its edges may create uneven porosity throughout the sub-surface layer. Such horizontal etching methods are likely to create regions of high porosity at and near to the exposed edges of the sub-surface layer, where the sub-surface layer is exposed to the electrolyte, with decreasing porosity further away from the layer edge. This effect may be particularly prevalent in larger structures, where problems with electrolyte and/or charge transport become more pronounced further away from the edges.

Preferably the surface layer and the sub-surface structure comprise III-nitride materials selected from the list consisting of: GaN, AlGaN, InGaN, InAlN and AlInGaN. The surface layer and the sub-surface structure may be formed from the same III-nitride material, or they may be formed of different III-nitride materials.

In a particularly preferred embodiment, the surface layer consists of GaN with a a charge carrier density of between $1\times10^{14}$ $cm^{-3}$ and $1\times10^{17}$ $cm^{-3}$, and the sub-surface structure consists of porous GaN.

In a preferred embodiment, the sub-surface structure is a sub-surface layer of a first III-nitride material. The surface layer and the sub-surface layer may be adjacent layers, so that an upper surface of the sub-surface layer is in contact with a lower surface of the surface layer, or they may be separated by intervening layers of III-nitride material.

Preferably the sub-surface layer may be one of a plurality of sub-surface layers formed from III-nitride material.

Preferably the threading dislocation density in both the surface layer and the sub-surface structure, or layer, is between $1\times10^{4}$ $cm^{-2}$ and $1\times10^{10}$ $cm^{-2}$. Particularly preferably the threading dislocation density in both the surface layer and the sub-surface structure, or layer, is at least $1\times10^{4}$ $cm^{-2}$, $1\times10^{5}$ $cm^{-2}$, $1\times10^{6}$ $cm^{-2}$, $1\times10^{7}$ $cm^{-2}$, or $1\times10^{8}$ $cm^{-2}$ and/or less than $1\times10^{9}$ $cm^{-2}$ or $1\times10^{10}$ $cm^{-2}$.

The thickness of the surface layer is preferably at least 1 nm, or 10 nm, or 100 nm, and/or less than 1 μm, or 5 μm, or 10 μm.

The surface layer is preferably a continuous layer of a second III-nitride material.

The thickness of the sub-surface structure, or sub-surface layer, is preferably at least 1 nm, or 10 nm, or 100 nm, and/or less than 1 μm, or 5 μm, or 10 μm, or 100 μm.

Particularly preferably, an outer surface of the surface layer has a minimum lateral dimension of at least 600 μm, or at least 1 mm, or at least 10 mm, or at least 5 cm, or at least 15 cm, or at least 20 cm.

Particularly preferably, the sub-surface structure is a continuous sub-surface layer. Preferably the sub-surface layer has a minimum lateral dimension of at least 600 μm, or at least 1 mm, or at least 10 mm, or at least 5 cm, or at least 15 cm, or at least 20 cm.

The surface layer may cover only the upper surface of the sub-surface structure. In other words, the sub-surface structure may be arranged below, or underneath, the surface layer, or the surface layer may be arranged over the sub-surface structure. The side-walls, or edges, of the sub-surface structure may be exposed, that is, not covered by the surface layer.

Alternatively, the sub-surface structure may be completely covered by the surface layer. That is, both the upper surface and the side-walls, or edges, of the sub-surface structure may be covered by the surface layer.

Preferably the porous sub-surface structure has an average pore size of greater than 1 nm, or 2 nm, or 10 nm, or 20 nm, and/or less than 50 nm, or 60 nm, or 70 nm. The porous sub-surface structure may be microporous. That is, it may have an average pore size of less than 2 nm. Alternatively, the porous sub-surface structure may be mesoporous. That is, it may have an average pore size between 2 nm and 50 nm. Alternatively, the porous sub-surface structure may be macroporous. That is, it may have an average pore size of greater than 50 nm.

The semiconductor structure may comprise a plurality of stacked sub-surface layers formed from III-nitride material, in which odd sub-surface layers are porous, with uniform porosity throughout the layer, and even sub-surface layers are non-porous. That is, the sub-surface layers may consist of a plurality of alternating porous/non-porous layers. Particularly preferably, each odd sub-surface layer may be porous and have the same porosity, and each even sub-surface layer may be non-porous. The difference in porosity between adjacent layers may lead to a difference in refractive index, such that the structure may act as a distributed Bragg reflector (DBR). By controlling the thicknesses of the layers and/or the porosities of the porous layers, the photonic stopband of the DBR may be tuned to reflect a desired wavelength of light. Particularly preferably the thicknesses of each sub-surface layers may be made equal to one quarter of the wavelength, or a multiple of one quarter wavelength, to be reflected by the DBR.

The semiconductor structures of the present invention exhibit good through-layer electrical conductivity, and provide the possibility of tuning their spectral response by varying the thicknesses of the surface layer and sub-layer(s). These structures may therefore be usable as microcavity structures for electrically driven VCSELs and quantum light sources.

In a preferred embodiment, at least two porous sub-surface layers have different porosities.

Particularly preferably the semiconductor structure is not patterned with trenches. In other words, the surface layer and sub-surface structure(s) may be continuous, or uninterrupted, across their entire width.

Preferably the upper, top, or outermost surface of the surface layer has a root mean square roughness of less than 10 nm, or less than 5 nm, or less than 2 nm, or less than 1 nm, or less than 0.5 nm, over an area of 1 micrometre squared. On c-plane GaN, for example, the root mean square roughness may be less than 1 nm over an area of 1 $\mu$m$\times$1 $\mu$m.

Low root mean square roughness is desirable in order to allow epitaxial overgrowth directly onto the semiconductor structure.

Preferably further III-nitride epitaxial layers and device structures may be deposited directly onto the semiconductor structure, after cleaning, by techniques such as MBE, MOCVD, or HVPE. Following this overgrowth, high performance optical and electrical devices may be fabricated on the structures. Suitable devices may include, for example, light-emitting diodes (LED), laser diodes (LD), high electron mobility transistors (HEMT), solar cells, and semiconductor-based sensor devices.

Preferably the top, outermost, or upper, surface of the surface layer is not coated with an electrically insulating layer. In other words, the top surface of the surface layer may be exposed.

According to a fourth aspect of the present invention, there is provided a semiconductor structure comprising a porous sub-surface structure of a first III-nitride material, and a surface layer of a second III-nitride material, the surface layer having a charge carrier density of between $1\times10^{14}$ cm$^{-3}$ and $1\times10^{17}$ cm$^{-3}$, in which the surface layer covers the sub-surface structure.

Preferably the surface layer completely covers the sub-surface structure. The sub-surface structure may be completely covered by the surface layer, such that the upper surface and all of the side-walls, or edges, of the sub-surface structure are covered by the surface layer.

The semiconductor structure may be a multi-layer semiconductor structure.

It would not be possible to form a semiconductor device in which the surface layer completely covers the sub-surface structure using the etching methods of the prior art, which require that the electrolyte contacts the material to be etched.

The semiconductor structure may be formed on an insulating base layer, for example a sapphire substrate, so that the "bottom", or lower, surface of the sub-surface structure (i.e. the surface facing away from the surface layer) will abut either the base layer, or a further sub-surface structure. Thus, the bottom surface of the sub-surface structure is not exposed to its surroundings.

As no portion of the sub-surface structure is exposed, it would not be possible to form such a semiconductor structure using the etching methods of the prior art, which require that a portion of any material to be etched is exposed to the electrolyte.

Preferably, the upper surface of the surface layer has a minimum lateral dimension of at least 1 $\mu$m, or 10 $\mu$m, or 50 $\mu$m, or 100 $\mu$m, or 500 $\mu$m, or at least 1 mm, or at least 10 mm, or at least 5 cm, or at least 15 cm, or at least 20 cm.

As the sub-surface structure is completely covered by the surface layer, the lateral width of the sub-surface structure will be less than the lateral width of the surface layer. As the surface layer may be very thin, however, there may only be a difference of a few nanometres or micrometres. Preferably, the sub-surface structure is a continuous sub-surface layer.

Particularly preferably the sub-surface structure has a minimum lateral dimension of at least 500 nm, 1 $\mu$m, 5 $\mu$m, 45 $\mu$m, 95 $\mu$m, or 1 mm, or at least 10 mm, or 5 cm, or 15 cm, or 20 cm.

In an exemplary preferred embodiment, a 20 $\mu$m$\times$20 $\mu$m$\times$20 $\mu$m cube of porous GaN is covered by a surface layer of GaN having a charge carrier density of between $1\times10^{14}$ cm$^{-3}$ and $1\times10^{17}$ cm$^{-3}$. The bottom surface of the cube is in contact with a sapphire substrate, while the other five faces of the cube are covered by the GaN surface layer.

Such a structure may be formed by the method of the present invention, by etching a 20 $\mu$m$\times$20 $\mu$m$\times$20 $\mu$m cube of GaN with a charge carrier density of greater than $1\times10^{14}$ cm$^{-3}$, completely covered by a surface layer of GaN having a charge carrier density of between $1\times10^{14}$ cm$^{-3}$ and $1\times10^{17}$ cm$^{-3}$. The method of the present invention allows electrochemical etching to proceed through a surface layer of III-nitride material, in order to porosify the material inside the cube. This would not be possible using the horizontal etching methods of the prior art, as these methods require that the layer to be porosified is exposed to electrolyte during etching.

Further features of the multi-layer semiconductor structure according to the fourth aspect may be as described above in relation to the third aspect of the invention.

According to a fifth aspect of the invention there is provided a use of a multi-layer semiconductor structure as a substrate for overgrowth of one or more semiconductor devices. The multi-layer semiconductor structure may be as described in relation to the second, third or fourth aspects of the invention, above.

According to a sixth aspect of the invention there is provided a use of a multi-layer semiconductor structure as a distributed Bragg reflector (DBR). The multi-layer semiconductor structure may be as described in relation to the second, third or fourth aspects of the invention, above.

As described above, the method according to the first aspect of the invention may be used to fabricate a multi-layer semiconductor structure comprising alternating layers of non-porous III-nitride material and porous III-nitride material. The difference in porosity between adjacent layers may lead to a difference in refractive index, such that the structure may act as a distributed Bragg reflector (DBR). By controlling the thicknesses of the layers and the porosities of the porous layers, the photonic stopband of the DBR may be tuned to reflect a desired wavelength of light. Particularly preferably the thicknesses of each sub-surface layers may be made equal to one quarter of the wavelength, or a multiple of one quarter wavelength, to be reflected by the DBR.

In a particularly preferred embodiment, non-porous GaN/ porous GaN DBRs may provide significant refractive index contrast, and are relatively straightforward to fabricate without worrying about strain management, and problems of cracking and dislocation generation, which are typically problematic for DBR synthesis. For example, conventional fabrication of epitaxial III-nitride DBRs is extremely challenging in the non-polar orientations, since there is no available ally that will lattice match to non-polar GaN (c-plane GaN can be lattice-matched by the low-refractive index In0.18A10.82N). The present invention, however, may provide crack-free and high-reflectance non-polar III-nitride DBRs.

Use of the multi-layer semiconductor structures of the present invention as DBRs beneath photonic devices could reflect downwardly-directed light, and thus significantly improve the light extraction efficiency of photonic devices.

According to a seventh aspect of the invention there is provided a device incorporating or mounted on a multi-layer semiconductor structure. The multi-layer semiconductor structure may be as described in relation to the second or third aspect of the invention, above.

Exemplary devices may include vertical-cavity surface-emitting lasers (VCSELs), or other quantum light sources, for which such multi-layer structures may form microcavity structures. Further devices which may incorporate such multi-layer semiconductor structures include LEDs and micropillar cavity structures for single photon sources.

According to an eighth aspect of the invention there is provided a method for porosifying GaN in a semiconductor structure comprising a sub-surface structure formed from a first GaN material, having a charge carrier density greater than $5 \times 10^{17}$ cm$^{-3}$, beneath a surface layer of a second GaN material, having a charge carrier density of between $1 \times 10^{14}$ cm$^{-3}$ and $1 \times 10^{17}$ cm$^{-3}$. The method comprises the steps of: exposing the surface layer to an electrolyte; and applying a potential difference between the sub-surface structure and the electrolyte, so that the sub-surface structure is porosified by electrochemical etching, while the surface layer is not porosified.

Further features of the method are as described above in relation to the first aspect of the invention.

BRIEF DESCRIPTION OF THE DRAWINGS

Specific embodiments of the invention will now be described with reference to the figures, in which:

FIG. 1 shows a schematic illustration of the experimental setup for electrochemical etching;

FIG. 2A shows a schematic illustration of a multi-layer semiconductor structure forming a distributed Bragg-reflector (DBR) according to an aspect of the present invention;

FIG. 2B shows a cross-sectional scanning electron microscopy (SEM) image of the multi-layer semiconductor structure of FIG. 2A;

FIG. 3A shows a top view Nomarski optical image of the etched sample of FIG. 2B;

FIG. 3B shows an atomic force microscopy (AFM) image of the surface layer of a non-etched region of the sample shown in FIG. 2B;

FIG. 3C shows an atomic force microscopy (AFM) image of the surface layer of an etched region of the sample shown in FIG. 2B;

FIG. 4 shows the measured reflectance spectrum of a GaN DBR structure according to a preferred embodiment of the present invention;

FIG. 5A shows an AFM image of the top surface of an etched semiconductor wafer forming a DBR;

FIG. 5B shows an AFM image of the top surface of an un-etched GaN epitaxial layer;

FIG. 6 is a photograph of an etched 2-inch semiconductor wafer forming a DBR according to a preferred embodiment of the present invention;

FIG. 7A shows photographs of a range of GaN DBR structures according to a preferred embodiment of the present invention; and FIG. 7B shows the measured reflectance spectra of the DBR structures of FIG. 7A;

FIG. 9A shows a schematic diagram of a multi-layer semiconductor structure comprising several III-nitride materials, according to a preferred embodiment of the present invention;

FIG. 9B shows an SEM image of the multi-layer semiconductor structure of FIG. 9A; and FIG. 9C shows a close-up SEM image of the multi-layer semiconductor structure of FIG. 9B.

DETAILED DESCRIPTION

Figure 8A:
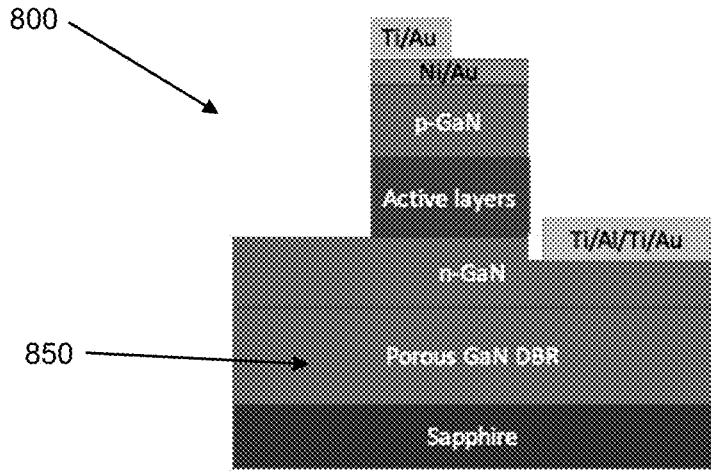
FIG. 8A shows a schematic diagram of an overgrown GaN-based LED on a GaN DBR substrate, according to a preferred embodiment of the present invention.

FIG. 1 shows a schematic of an electrochemical (EC) experimental setup usable in the method of the present invention. As shown in FIG. 1, the experimental setup consists of a two-electrode electrochemical cell 100, with a sample 110 connected as an anode and a platinum foil 120 connected as a cathode. The platinum cathode, and at least a portion of the surface layer of the sample, are exposed to an electrolyte 130 by immersion in the electrolyte. A constant current DC power supply 140 is connected between the anode and the cathode, and an ammeter 150 is used to monitor and record the etching current flowing through the circuit.

Unless otherwise stated, the EC etching experiments described herein were conducted at room temperature with a semiconductor structure as the anode and a platinum foil as the counter electrode (cathode). Oxalic acid with a concentration of 0.25 M was used as the electrolyte. The etching process was carried out in a constant voltage mode controlled by a Keithley 2400 source meter. After etching, samples were rinsed with deionized water and blow dried in N2.

As discussed above in the summary of invention, the skilled person will appreciate that the term "undoped" is relatively imprecise in semiconductor technology. Practically speaking, all semiconductor material contains inherent impurities which can be thought of as "dopant" atoms. Different methods of semiconductor growth may produce different levels of impurity, and thus different inherent charge carrier concentrations.

Thus, it is possible that semiconductor materials referred to in the prior art as "undoped" may have high impurity levels, such that they have a natural charge carrier density of above $1 \times 10^{17}$ cm$^{-3}$ arising from impurities alone.

In appreciation of this, the inventors of the present invention prefer to use the term "non-intentionally-doped" (NID) to refer to semiconductor material that has been made without intentional doping. The impurity levels of semiconductor materials naturally depend on factors including the method by which they are formed, the environment in which they are formed, and the purity of the reactants used to form the semiconductor materials.

In the present application, the term "non-intentionally-doped" (NID) should be understood to refer to semiconductor materials deliberately grown to be as pure as possible, which have been measured to have a charge carrier density of between $1 \times 10^{14}$ cm$^{-3}$ and $1 \times 10^{17}$ cm$^{-3}$.

Semiconductor materials which have been intentionally doped with n-type dopants to obtain a charge carrier density greater than $5 \times 10^{17}$ cm$^{-3}$, may be referred to as "n+" semiconductor material FIG. 2A shows a schematic diagram of an epitaxial non-polar sample structure, which consists of alternating layers of non-intentionally-doped GaN (NID-GaN) and heavily doped n-type GaN (n+-GaN) layers. The NID-GaN layers have a charge carrier density of less than $1 \times 10^{17}$ cm$^{-3}$, while the n+-GaN layers have a nominal silicon doping concentration of $2.3 \times 10^{19}$ cm$^{-3}$. Each of the alternating NID-GaN/n+-GaN layers has a thickness of approximately 136 nm.

The sample comprises an uppermost surface layer of NID-GaN and 10 pairs of alternating NID-GaN/n+-GaN layers, arranged on a sapphire substrate and underlying base layers of lightly doped n-type GaN (n-GaN) and NID-GaN. The n-GaN layer has a thickness of 2 µm and is present for uniform distribution of the anodization bias across the sample.

The sample was grown by metal-organic vapour phase epitaxy (MOVPE) in a 6×2 in. Thomas Swan close-coupled showerhead reactor on r-plane sapphire substrates using trimethylgallium and ammonia as precursors, hydrogen as a carrier gas and silane for n-type doping. Firstly, a 4 µm thick a-plane GaN pseudosubstrate was grown with a nominal dislocation density of ~$4 \times 10^9$ cm$^{-2}$, and a basal plane stacking fault density of ~$5 \times 10^5$ cm$^{-1}$, in which a single SiNx interlayer was used for defect reduction. After the growth of another 500 nm undoped GaN layer, 10 pairs of alternating n+-GaN and NID-GaN layers were grown.

The sample of FIG. 2A was electrically contacted by soldering an indium wire to the edge of the sample. A portion of the sample, of approximately 1 cm×1 cm in size, was then immersed in the electrolyte. Using the experimental setup shown in FIG. 1, an EC etching process was carried out on the sample in a constant voltage mode, with a DC bias of 6 V, and controlled by monitoring and recording the etching current signal at room temperature without UV illumination.

The EC porosification process begins with the oxidation of the alternating n+-GaN layers by localised injection of holes upon the application of a positive anodic bias, and localised dissolution of such oxide layer in the acid-based electrolyte will result in the formation of a mesoporous structure. The end of the anodisation process is reached when the etching current drops to the base line level, indicating that all the n+-GaN layers have been etched and transformed into mesoporous GaN layers, typically after approximately 30 minutes.

The cross-sectional scanning electron microscopy (SEM) image in FIG. 2B shows the morphology of the porous DBR structure 200. The cross-section of FIG. 2B was taken from an edge cleaved post-etching, far away from the original sample edges. This confirms that the porosification process proceeded extremely uniformly across the entire sample area that was immersed in the etching solution. This also confirms that the etched layer morphology is indeed mesoporous, as the average pore size is approximately 30 nm.

FIG. 2B further shows that the NID-GaN layers stay almost intact during the EC etching, and are not themselves porosified. Only the n+-GaN layers are selectively etched and transformed into mesoporous layers of mesoporous GaN (MP-GaN).

The 1 cm×1 cm sample is far larger than samples porosified by horizontal etching in the prior art, as horizontal etching would be unable to penetrate horizontally into the centre of such a large sample without regular trenches in the sample surface. Furthermore, the etching time of 30 minutes would be insufficient for horizontal etching to proceed far into the bulk material of the sample. Thus the porous cross-section of FIG. 2B, taken far from the sample edges, is evidence that the n+-GaN layers have been etched through the surface layer of NID-GaN, and not horizontally from the sample edges.

FIG. 3A shows a top view Nomarski optical image of the as—etched sample, where a boundary (marked by the white arrow) that corresponds to the position of the sample being immersed in the EC etching solution can be seen. The optical contrast between the regions with and without the porous structure arises due to the altered refractive index of the porosified layers, leading to a far higher reflectivity in the etched region. The sharp boundary between etched and non-etched regions provides further evidence of etching through the surface layer, as uniform reflectivity (and thus porosity) is achieved far from the edges of the structure.

To evaluate possible etching damage of the top surface layer of NID-GaN, atomic force microscopy (AFM) images were taken from non-porous and porous regions, which are shown in FIGS. 3B and 3C, respectively. Apart from some dirt/small particles present in the porous region that may be related to the EC etching products, contaminants in the etching chemicals and/or sample cleaning, no changes to the surface morphology were observed and the root mean square roughness (RRMS) of the top GaN surface is similar in both the etched and unetched regions, at around 1 nm roughness measured over a 1 µm×1 µm area. It appears therefore that the sub-surface EC porosification does not degrade the surface of the GaN surface layer, and the RRMS of the post-etching sample is sufficiently low for further semiconductor overgrowth.

Such a porous DBR could therefore be used as a bottom mirror template for the regrowth of other heterostructures or, for example, deposition of high quality dielectric DBRs in order to form a planar microcavity.

The porous DBR structure illustrated in FIGS. 2B to 3C is formed purely by epitaxial growth of alternating NID-GaN/n+-GaN layers, followed by EC porosification. By using the method of the present invention there is no need to protect the sample surface with SiO2, or to pattern the sample with regular trenches. There is also no need to use UV illumination.

The reflectance spectra of the etched GaN/MP-GaN DBR were measured using a micro-reflectance setup using ambient room light and normalized to a commercial silver mirror with a spot size of ~1 μm. FIG. 4 shows the measured reflectance spectrum of a GaN/mesoporous-GaN DBR structure with a peak reflectance centred at ~564 nm and a stop-band with a full-width at half-maximum of 91 nm.

A peak reflectance of more than 96% is achieved on non-polar GaN/MP-GaN DBR structure with a very large spectral width, more than 80 nm. We note that the measured peak reflectance is slightly lower than that of the simulated values, which could be attributed to the local non-uniformity of the mesoporous GaN layer and the through-layer etching pathways where these lead to some slight porosification of the NID-GaN. Nevertheless, to the inventors' knowledge, this is the highest reported peak reflectance from a non-polar III-nitride DBR structure, and there is also an increase of more than a factor of 2 in the stop-band width compared to previously reported structures. This is attributed to the fact that a much larger refractive index contrast can be achieved using mesoporous GaN layers without introducing a significant lattice mismatch which would lead to large strains and degradation of structural quality (via the formation of cracks and generation of dislocations). In contrast, the more usual method for the fabrication of nitride DBRs, the use of Al-containing epitaxial layers on GaN, such as Al(Ga)N and InAlN to achieve a refractive index contrast, inevitably leads to significant strain in at least one in-plane direction for non-polar structures.

In another experiment, an equivalent DBR structure was epitaxially grown on a circular semiconductor wafer with a diameter of 2 inches (5.08 cm). A portion of the wafer was then immersed in electrolyte and etched as described above in relation to FIGS. 1 to 2B. The etching time for a typical 2-inch wafer at 6 V was less than 6 hours.

The wafer-scale fabrication of the mesoporous GaN DBR was found to be correlated with the threading dislocation density. The inventors believe that these threading dislocations act as through-layer etching pathways and facilitate sub-surface etching through the surface layer and downwards through the multi-layer structure. Only perfect threading dislocations appear to be responsible for the through-layer etching pathways.

In order to achieve 2-inch wafer-scale formation of mesoporous GaN DBRs, it may be necessary for the surface layer and sub-surface layers to have a minimum threading dislocation density of at least $1 \times 10^4$ cm$^{-2}$.

Due to the presence of threading dislocations, the EC process initiated from the top NID-GaN surface appears to proceed through the threading dislocation sites downwards into the multi-layer structure. Once the etchant reaches a sub-surface layer with a charge carrier density of greater than $5 \times 10^{17}$ cm$^{-3}$, etching proceeds outwards from the threading dislocation into the n+-GaN layer, due to the conductivity selective nature of the EC process.

FIGS. 5A and 5B show AFM images of the top NID-GaN surface of a finished wafer-scale DBR sample and a standard as-grown GaN epitaxial layer. The surface morphology of the porous DBR is almost identical to the as-grown GaN epitaxial layer. The surface roughness (root mean square roughness over 5 μm×5 μm scan) is found to be very similar and can be maintained at ~0.4 nm.

FIG. 6 is a photograph of the as—etched 2-inch semiconductor wafer 600 under room light illumination, showing the reflection of a card printed with a logo. While the region close to the wafer-flat is transparent and unetched, the intense reflection in the etched DBR region demonstrates the uniform EC porosification process and the realization of high reflectance non-polar GaN/MP-GaN DBRs on a wafer-scale. Given the fact that uniform porosification occurs across the entire 2-inch wafer, it is confirmed again that the sub-surface layers of n+-GaN are electrochemically etched downwardly through the surface layer of NID-GaN, and all of the intermediate layers of NID-GaN, in addition to any lateral etching occuring at the wafer edges.

Although the local refractive index of the NID-GaN layers may have been altered by the through-layer etching, the measured reflectivity values are very close to the theoretical values and the density of such through-layer etching pathways is considered to be low enough (~2×10$^9$ cm$^{-2}$), that the global reflectivity at the wafer scale (~ 5 cm diameter) is only marginally affected.

The majority of the material exhibits a sufficient reflectivity, unaffected by these issues, to allow the fabrication of devices such as LEDs and micropillar cavity structures for single photon sources with reasonable yield.

Improved GaN pseudosubstrates with a much lower density of perfect dislocations still show porosification, even when the typical dislocation spacing is a few microns or more, which will reduce the effect of the vertical etching pathways further while still allowing wafer scale fabrication.

Tunability of the DBR can be achieved simply by varying the thicknesses of the NID-GaN and n+-GaN layers. FIGS. 7A and 7B show photographs under room light illumination and the measured reflectance spectra of various GaN/porous GaN DBR structures. A widely tunable stop-band with high reflectance (>96%) across the entire visible spectrum is demonstrated, simply by varying the epitaxial layer thicknesses of the NID-GaN and n+-GaN. Due to the large refractive index contrast between the GaN and porous GaN layers, the stop-band widths are also maintained to be very wide (>80 nm).

Particularly preferably, porous GaN structures according to the present invention may be usable as substrates, or "pseudo-substrates", for further overgrowth or deposition of additional semiconductor material. In other words, it may advantageously be possible to deposit or overgrow additional layers of III-nitride material, or other semiconductor material, onto the porosified semiconductor structures of the present invention, in order to form a variety of devices. The excellent reflectivity characteristics exhibited by the DBR examples above, for example, make DBRs formed according to the present invention promising as pseudo-substrates for overgrowth of optoelectronic devices such as LEDs.

Particularly advantageously, the present method allows preparation of porosified semiconductor structures with "epi-ready" surfaces, that is, upper surfaces with sufficiently low roughness that additional semiconductor layers can be epitaxially grown directly onto the structures For example, porous GaN based DBR pseudo-substrates according to embodiments of the present invention can be used for the manufacture of III-nitride LEDs, lasers, single photon sources, and can also be used for the formation of hybrid cavity structures and devices.

FIG. 8A shows a GaN-based LED structure 800 on a NID-GaN/MP-GaN DBR 850, as described above in relation to FIGS. 2 to 7. Following formation of the DBR according to the method described above, further semiconductor layers are epitaxially grown on the DBR according to known epitaxial techniques, so as to form a light emitting diode (LED). The DBR thus acts as a pseudo-substrate for overgrowth of the LED.

The overgrown LED structure comprises a simple p-i-n structure, containing 5 periods of 2.5 nm InGaN quantum wells separated by 7.5 nm thick GaN barriers. The bottom of the active region is clad by a 500 nm-thick layer of Si-doped n-type GaN with a charge carrier density of $3 \times 10^{18}$ cm$^3$, and the upper end of the active region is clad by a 300 nm-thick layer of Mg-doped p-type GaN.

Electrically injected LED devices were fabricated using chlorine based inductively coupled plasma etching to form mesas. A Ti/Al/Ti/Au metal stack annealed in N$_2$ serves as the n-type contact and a thin Ni/Au layer annealed in a mixture of N$_2$/O$_2$ acts as a semi-transparent current spreading layer on top of the p-type GaN layer, beneath a Ti/Au p-type contact.

Figure 8B:
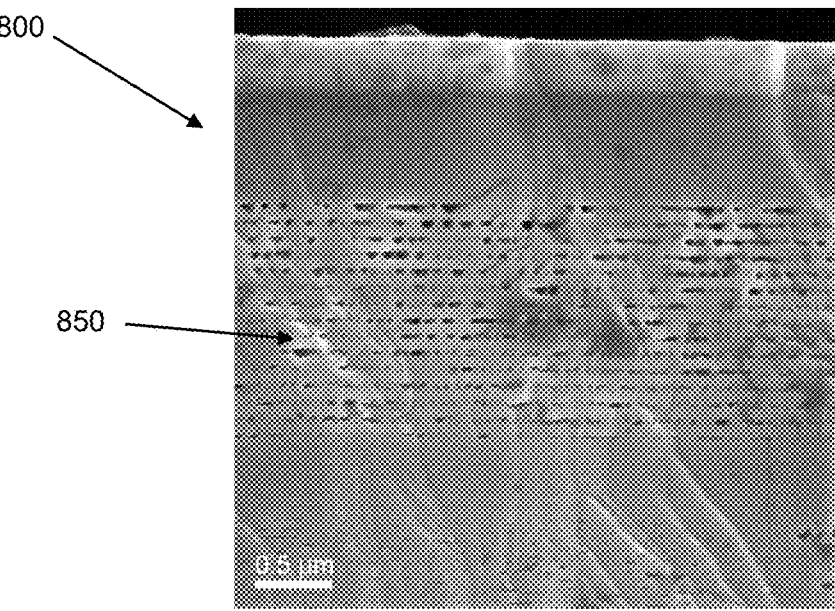
FIG. 8B shows a cross-sectional SEM image of the overgrown LED structure of FIG. 8A.

FIG. 8B shows a cross-sectional SEM image of the overgrown LED structure 800 on a porous GaN DBR pseudo-substrate 850. The pore morphology of the DBR has been retained the overgrowth process.

Figure 8C:
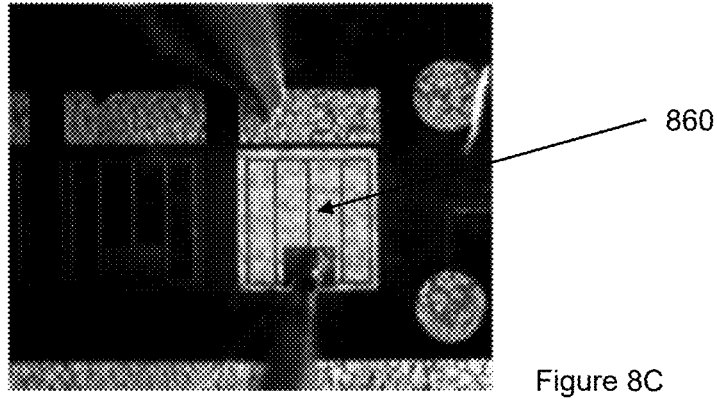
FIG. 8C shows a photograph of a GaN LED structure without an underlying porous GaN DBR.
Figure 8D:
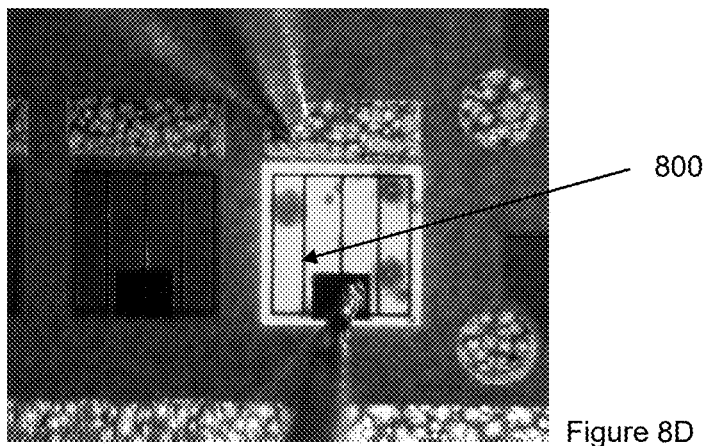
FIG. 8D shows a photograph of a GaN LED structure formed on top of a porous GaN DBR, according to a preferred embodiment of the present invention.

FIG. 8C shows a photograph of a similar LED structure 860 without an underlying porous GaN DBR, while FIG. 8D shows the same LED structure 800 formed on a porous GaN DBR 850 as described above. By comparison, the LED that has been overgrown on a porous GaN DBR is far brighter than the LED without a GaN DBR as a pseudo-substrate. The intensity of the optical emission can be seen to be very uniform across the device of FIG. 8D, and is only interrupted by dislocations and GaN material non-uniformities, which may have resulted from improper cleaning of the DBR before overgrowth.

Figure 8E:
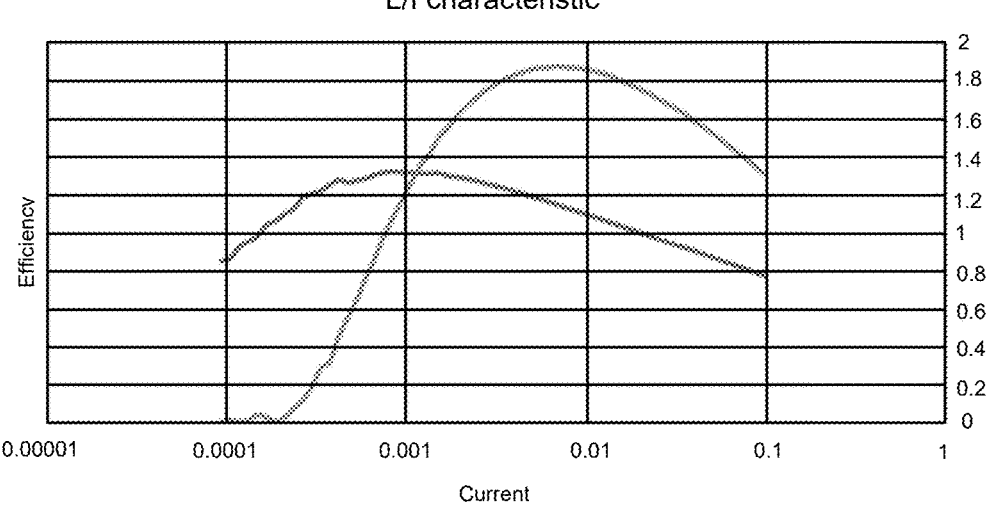
FIG. 8E shows the room temperature electroluminescence (EL) "internal quantum efficiency" (IQE) for LEDs with and without porous GaN DBRs as pseudo-substrates.

FIG. 8E shows the room temperature electroluminescence (EL) "internal quantum efficiency" (IQE) as a function of current density for LEDs with and without porous GaN DBRs as pseudo-substrates. The LEDs formed on a non-porous DBR exhibit a low IQE, and decreases at a low current density, while the IQE of the LED/porous GaN DBR exhibits a much higher peak efficiency and starts to decrease at more than one order of magnitude higher current density.

FIG. 9A is a schematic diagram of a multi-layer semiconductor structure forming a GaN HEMT transistor structure, according to a preferred embodiment of the present invention. The structure comprises several III-nitride materials.

The structure shown in FIG. 9A was epitaxially grown by MOVPE on a 2-inch sapphire wafer 910, according to known methods. First, a layer A of NID-GaN, with a charge carrier density of between $1 \times 10^{14}$ cm$^{-3}$ and $1 \times 10^{17}$ cm$^{-3}$, was deposited on the sapphire substrate, followed by a 5 μm-thick layer B of GaN with a charge carrier density of greater than $5 \times 10^{17}$ cm$^{-3}$. A 250 nm-thick layer C of GaN with a charge carrier density greater than $5 \times 10^{17}$ cm$^{-3}$. The charge carrier density of layer C was made greater than the charge carrier density of layer B by intentionally doping layer C to a higher degree. A 500 nm-thick layer D of NID-GaN, with a charge carrier density of between $1 \times 10^{14}$ cm$^{-3}$ and $1 \times 10^{17}$ cm$^{-3}$, was then deposited on top of layer C. A 1 nm-thick layer E of NID-AlN was then formed on layer D, followed by a 25 nm-thick layer F of NID-Al0.25GaN and a 2 nm-thick surface layer G of NID-GaN.

An electrical contact was made on the side of this multi-layer structure, and the wafer was immersed in electrolyte and etched as described in relation to FIG. 1, above.

FIGS. 9B and 9C are SEM images of a cross-section of the wafer post-etching. The cross section was taken far from the edges of the wafer, demonstrating that the porosification had occurred by etching through the surface layer, and not by horizontal etching from the edges of the wafer. Due to the limitations of the prior art methods, discussed above, horizontal etching of an entire 2-inch wafer is not possible.

It can be seen from FIGS. 9B and 9C that layers E, F and G, and the NID-GaN layer D have not been porosified, as their charge carrier densities are between $1 \times 10^{14}$ cm$^{-3}$ and $1 \times 10^{17}$ cm$^{-3}$. GaN layer C below, however, has been porosified to a high degree due to its high charge carrier density, and can be seen to have relatively large pores distributed throughout the layer. GaN layer B has also been porosified, as prior to etching it had a charge carrier density of greater than $5 \times 10^{17}$ cm$^{-3}$. However, the pores formed in layer B are far smaller than those in layer C, due to the lower charge carrier density of layer B.

FIG. 9B therefore shows that electrochemical etching has occurred through the non-intentionally-doped surface layer, as well as the NID layers of AlGaN and AlN. It is therefore clear that the method of the present invention is capable of porosifying multiple sub-surface layers, in a variety of positions in a multi-layered semiconductor structure, and of producing differing porosities based on the initial charge carrier densities of the III-nitride materials.

What is claimed is:

1. A semiconductor structure comprising:
  a porous sub-surface structure of a first III-nitride material; and
  a non-porous surface layer of a second III-nitride material; the surface layer having a charge carrier density of between $1 \times 10^{14}$ cm$^{-3}$ and $1 \times 10^{17}$ cm$^{31}$ $^3$;
  in which the sub-surface structure has porosity throughout the porous sub-surface structure, the surface layer having a lateral width and the sub-surface structure having a lateral width, in which the lateral width of the surface layer at a narrowest point thereof is more than 550 μm, and in which the lateral width of the sub-surface structure at a narrowest point thereof is more than 550 μm.

2. The semiconductor structure according to claim 1, in which the surface layer completely covers the sub-surface structure.

3. The semiconductor structure according to claim 1, in which the surface layer has a minimum lateral dimension of at least 1 mm, or at least 10 mm, or at least 5 cm, or at least 15 cm, or at least 20 cm.

4. The semiconductor structure according to claim 1, in which the surface layer and the sub-surface structure comprise III-nitride materials selected from the list consisting of: GaN, AlGaN, InGaN, and AlInGaN.

5. The semiconductor structure according to claim 1, in which a threading dislocation density in both the surface layer and the sub-surface structure is at least $1 \times 10^4$ cm$^{-2}$, $1 \times 10^5$ cm$^{-2}$, $1 \times 10^6$ cm$^{-2}$, $1 \times 10^7$ cm$^-$2, or $1 \times 10^8$ cm$^{-2}$ and/or less than $1 \times 10^9$ cm$^{-2}$ or $1 \times 10^{10}$ cm$^{-2}$.

6. The semiconductor structure according to claim 1, in which a thickness of the surface layer is at least 1 nm, or 10 nm, or 100 nm, and/or less than 1 μm, or 5 μm, or 10 μm.

7. The semiconductor structure according to claim 1, in which the porous sub-surface structure has an average pore size of greater than 1 nm, or 2 nm, or 10 nm, or 20 nm, and/or less than 50 nm, or 60 nm, or 70 nm.

8. The semiconductor structure according to claim 1, comprising a plurality of sub-surface layers formed from III-nitride material in the form of a stack of layers; in which odd-numbered sub-surface layers (counting away from the surface layer) are porous, with uniform porosity throughout each layer, and even-numbered sub-surface layers are non-porous.

9. The semiconductor structure according to claim 8, in which each odd sub-surface layer has the same porosity, and each even layer is non-porous, such that the structure acts as a distributed Bragg reflector (DBR).

10. The semiconductor structure according to claim 8, in which at least two odd sub-surface layers have different porosities.

11. The semiconductor structure according to claim 1, in which the semiconductor structure is not patterned with trenches.

12. The semiconductor structure according to claim 1, in which the semiconductor structure is not pre-patterned with trenches separated by less than 1 cm, or 5 mm, or 1 mm, or 600 µm, or 400 µm, or 200 µm.

13. The semiconductor structure according to claim 1, in which an outermost surface of the surface layer has a root mean square roughness of less than 10 nm, or less than 5 nm, or less than 2 nm, or less than 1 nm, or less than 0.5 nm, over an area of 1micrometer squared.

14. The semiconductor structure according to claim 1, in which the surface layer is not coated with an electrically insulating layer.

15. A method of manufacturing a semiconductor device, the method comprising overgrowing a semiconductor device on the semiconductor structure of claim 1.

16. The method of claim 15, in which the semiconductor device of claim 15 is a laser or a light emitting diode.

17. A device incorporating or mounted on the semiconductor structure of claim 1.

18. A semiconductor structure comprising:

a porous sub-surface structure of a first III-nitride material; and a surface layer of a second III-nitride material; the surface layer having a charge carrier density of between $1\times10^{14}$ cm$^{31}$ $^3$ and $1\times10^{17}$ cm$^{-3}$;

in which the porous sub-surface structure has porosity throughout the porous sub-surface structure, the surface layer having a lateral width and the porous sub-surface structure having a lateral width, in which the lateral width of the surface layer at a narrowest point thereof is more than 550 µm, and in which the lateral width of the porous sub-surface structure at a narrowest point thereof is more than 550 µm.

19. A semiconductor structure comprising:

a porous sub-surface structure of a first III-nitride material; and a non-porous surface layer of a second III-nitride material; the surface layer having a charge carrier density of between $1\times10^{14}$ cm$^{-3}$ and $1\times10^{17}$ cm$^{-3}$;

in which the porous sub-surface structure is porous throughout the sub-surface structure, in which the surface layer has a plurality of lateral dimensions and a minimum lateral dimension which is the smallest of those lateral dimensions, in which the porous sub-surface structure has a plurality of lateral dimensions and a minimum lateral dimension which is the smallest of those lateral dimensions, in which the minimum lateral dimension of the surface layer is more than 550µm, and in which the minimum lateral dimension of the porous sub-surface structure is more than 550 µm.

20. A device incorporating or mounted on the semiconductor structure of claim 19.

* * * * *